United States Patent
Umehara et al.

(10) Patent No.: US 11,598,827 B2
(45) Date of Patent: Mar. 7, 2023

(54) METHOD OF DESIGNING AND MANUFACTURING MAGNETIC SENSOR

(71) Applicant: TDK Corporation, Tokyo (JP)

(72) Inventors: Tsuyoshi Umehara, Tokyo (JP); Kentaro Harada, Tokyo (JP); Takafumi Kobayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 17/543,951

(22) Filed: Dec. 7, 2021

(65) Prior Publication Data
US 2022/0229124 A1   Jul. 21, 2022

(30) Foreign Application Priority Data
Jan. 20, 2021   (JP) .............................. JP2021-007324

(51) Int. Cl.
*G01R 33/09* (2006.01)
*G01R 33/00* (2006.01)

(52) U.S. Cl.
CPC ....... *G01R 33/093* (2013.01); *G01R 33/0052* (2013.01)

(58) Field of Classification Search
CPC .............. G01R 33/093; G01R 33/0052; G01R 33/098; G01R 33/09
See application file for complete search history.

(56) References Cited

U.S. PATENT DOCUMENTS

| 2009/0190262 A1* | 7/2009 | Murakami | B82Y 25/00 360/324.11 |
| 2012/0050920 A1* | 3/2012 | Takeo | B82Y 25/00 148/301 |
| 2017/0336229 A1* | 11/2017 | Watanabe | G01D 18/00 |
| 2018/0254686 A1* | 9/2018 | Komasaki | G01R 33/093 |
| 2019/0277660 A1* | 9/2019 | Makino | G02B 27/646 |

FOREIGN PATENT DOCUMENTS

| JP | 2013-088232 A | 5/2013 |
| JP | 2016-206075 A | 12/2016 |

* cited by examiner

*Primary Examiner* — Alvaro E Fortich
(74) *Attorney, Agent, or Firm* — Posz Law Group, PLC

(57) ABSTRACT

A method of designing a magnetic sensor that can easily accommodate various design conditions is provided. The method has:
  preparing magnetic sensors, wherein, for each magnetic sensor, magnetization directions of the first to fourth magnetically pinned layers form first to fourth angles $\theta1$ to $\theta4$ relative to a specific reference angle, respectively, and $\theta1=\theta3$, $\theta2=\theta4$, $\theta1 \neq \theta2$, and each magnetic sensor has a value of $\theta1-\theta2$ that is different from values of $\theta1-\theta2$ of remaining magnetic sensors,
  for each magnetic sensor, obtaining a relationship between an angular range of the magnetization direction of the first to fourth magnetically free layers and an output range of the magnetic sensor, wherein the angular range satisfies a specific linear relationship between the magnetization direction and the output of the magnetic sensor, and
  selecting a magnetic sensor that satisfies required conditions for the angular range and the output range from among the magnetic sensors.

8 Claims, 7 Drawing Sheets

METHOD OF DESIGNING AND MANUFACTURING MAGNETIC SENSOR

BACKGROUND OF THE INVENTION

1. Field of the Invention

The present application is based on, and claims priority from, JP2021-7324, filed on Jan. 20, 2021, the disclosure of which is hereby incorporated by reference herein in its entirety.

The present invention relates to a method of designing and manufacturing a magnetic sensor, particularly to a method of designing and manufacturing a magnetic sensor using a magnetoresistive effect element.

2. Description of the Related Art

A magnetic sensor using a magnetoresistive effect element is known. A magnetoresistive effect element has a magnetically pinned layer whose magnetization direction is pinned relative to an external magnetic field and a magnetically free layer whose magnetization direction rotates relative to the external magnetic field. Such a magnetic sensor may be used to detect the direction in which an external magnetic field is applied. JP2013-88232 and JP2016-206075 disclose a magnetic sensor in which magnetoresistive effect elements are interconnected by a bridge circuit. The output of the magnetic sensor changes in a substantially sinusoidal manner in response to the change of the direction in which an external magnetic field is applied. For this reason, the magnetization direction of the magnetically pinned layer is determined such that the magnetic sensor operates in a relatively linear region of the output.

SUMMARY OF THE INVENTION

A magnetic sensor is typically incorporated into a product or into a part for use. In general, the positions of a magnet that generates an external magnetic field and the magnetic sensor are determined depending on the design of the product or the part. Therefore, the direction of the external magnetic field that is applied to the magnetically free layer of the magnetic sensor varies depending on products. In addition, linearity and output range that are required for a magnetic sensor also vary depending on products. As a result, magnetic sensors need to be designed for each product in accordance with these conditions, and simplification of the design method is desired.

The present invention aims at providing a method of designing a magnetic sensor that can easily accommodate various design conditions.

A method of designing a magnetic sensor relates to a magnetic sensor that comprises:

a pair of a first magnetoresistive effect element and a second magnetoresistive effect element that are connected in series; and a pair of a third magnetoresistive effect element and a fourth magnetoresistive effect element that are connected in series, wherein the pair of the first and second magnetoresistive effect elements and the pair of the third and fourth magnetoresistive effect elements are connected in parallel, the first and fourth magnetoresistive effect elements are connected to a power supply, and the first to fourth magnetoresistive effect elements have first to fourth magnetically pinned layers whose magnetization directions are pinned and first to fourth magnetically free layers whose magnetization directions rotate in accordance with an external magnetic field, respectively.

The method comprises the steps of:

preparing magnetic sensors, wherein, for each magnetic sensor, magnetization directions of the first to fourth magnetically pinned layers form first to fourth angles $\theta 1$ to $\theta 4$ relative to a specific reference angle, respectively, and $\theta 1 = \theta 3$, $\theta 2 = \theta 4$, $\theta 1 \neq \theta 2$, and each magnetic sensor has a value of $\theta 1 - \theta 2$ that is different from values of $\theta 1 - \theta 2$ of remaining magnetic sensors, for each magnetic sensor, obtaining a relationship between an angular range of the magnetization direction of the first to fourth magnetically free layers and an output range of the magnetic sensor, wherein the angular range satisfies a specific linear relationship between the magnetization direction and the output of the magnetic sensor, and selecting a magnetic sensor that satisfies required conditions for the angular range and the output range from among the magnetic sensors.

According to the present invention, it is possible to provide a method of designing a magnetic sensor that can easily accommodate various design conditions.

The above and other objects, features and advantages of the present invention will become apparent from the following description with reference to the accompanying drawings which illustrate examples of the present invention.

DESCRIPTION OF EMBODIMENTS

First Embodiment

Figure 1A:
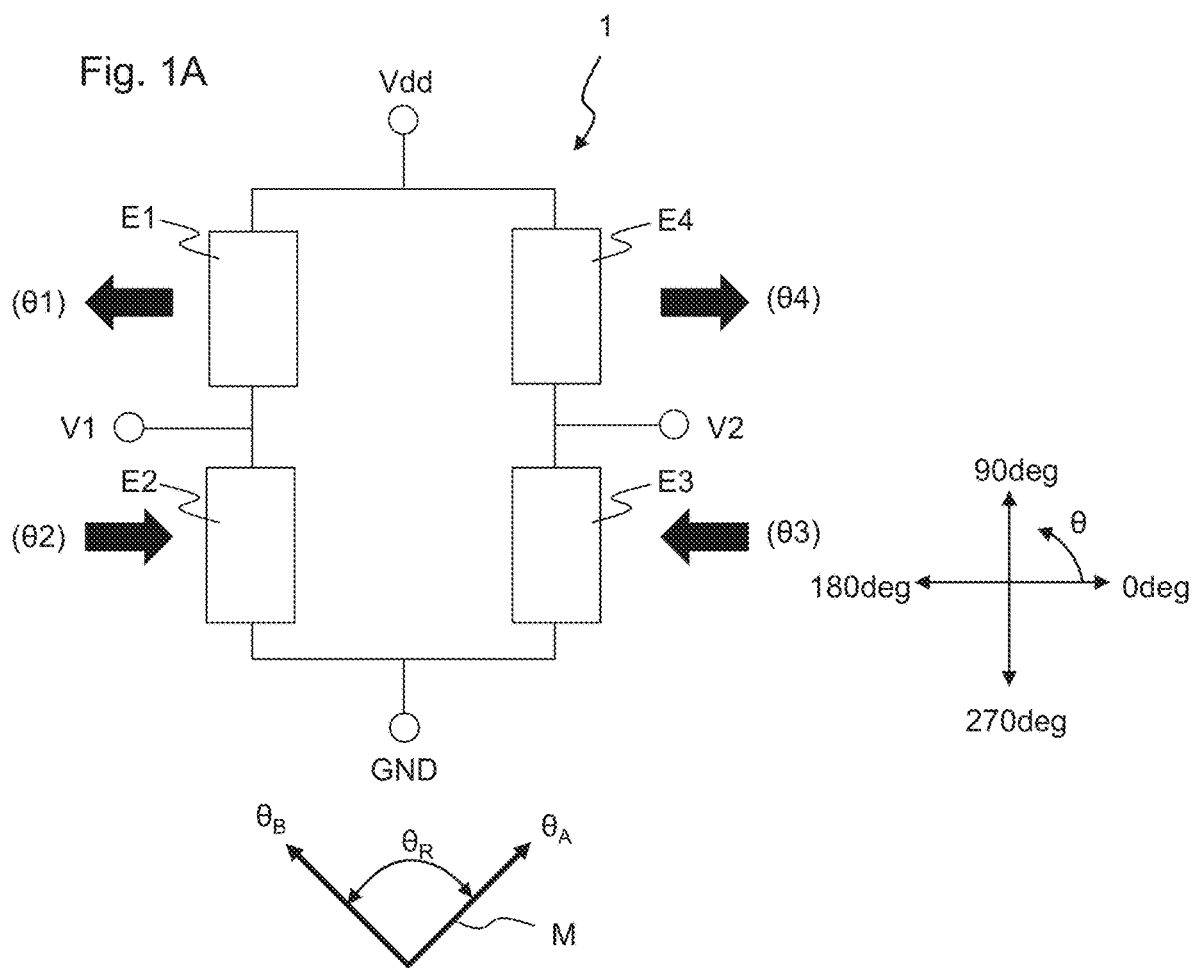
FIGS. 1A and 1B are conceptual views illustrating the operation principle of a magnetic sensor according to a first embodiment.

Some embodiments of the present invention will now be described with reference to the drawings. In the following description and the drawings, the Z direction corresponds to a direction in which layers of a magnetoresistive effect element are stacked. The magnetization directions of magnetically pinned layer 14 and magnetically free layer 16, as well as the direction of an external magnetic field, are represented by angle $\theta$ that is defined counterclockwise with 0 degree corresponding to three o'clock, as shown in FIG. 1A. The angle θ=0 degree may be referred to as "a specific reference angle".

Figure 1B:
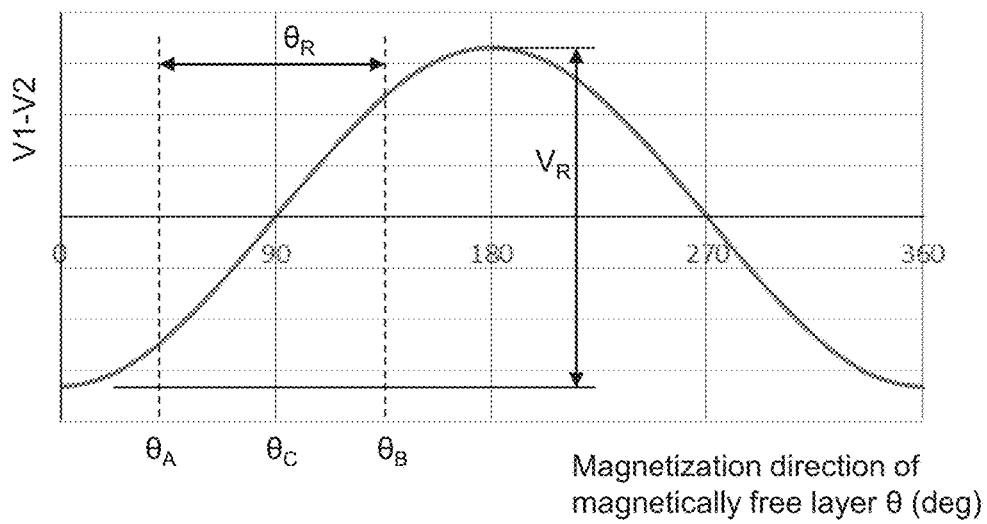

FIG. 1A, 1B are conceptual view illustrating the operation principle of magnetic sensor 1, wherein FIG. 1A conceptually shows the circuit arrangement of magnetic sensor 1, and FIG. 1B shows the relationship between the magnetization direction of magnetically free layer 16 and the output of magnetic sensor 1. Magnetic sensor 1 has four magnetoresistive effect elements (hereinafter, referred to as first magnetoresistive effect element E1, second magnetoresistive effect element E2, third magnetoresistive effect element E3 and fourth magnetoresistive effect element E4), and these magnetoresistive effect elements E1 to E4 are interconnected by a bridge circuit (a Wheatstone bridge). Four magnetoresistive effect elements E1 to E4 are divided into two pairs, and magnetoresistive effect elements E1, E2 and magnetoresistive effect elements E3, E4 in each pair are connected in series. Further, the pair of magnetoresistive effect elements E1, E2 and the pair of magnetoresistive effect elements E3, E4 are connected in parallel. The pair of magnetoresistive effect elements E1, E2 and the pair of magnetoresistive effect elements E3, E4 are connected to power supply $V_{dd}$ having a constant voltage at one end thereof and are grounded (GND) at the other end. Magnetoresistive effect elements E1, E4 are arranged on the side of power supply $V_{dd}$, and magnetoresistive effect elements E2, E3 are arranged on the side of GND. Both intermediate voltage V1 between first magnetoresistive effect element E1 and second magnetoresistive effect element E2 and intermediate voltage V2 between third magnetoresistive effect element E3 and fourth magnetoresistive effect element E4 are outputted, and differential voltage V1-V2 is outputted as the output of magnetic sensor 1. Intermediate voltages V1, V2 are calculated as follows, where R1 to R4 are the electric resistivities of first to fourth magnetoresistive effect elements E1 to E4, respectively.

$$V_1 = \frac{R_2}{R_1 + R_2} V_{dd} \quad (1)$$

$$V_2 = \frac{R_3}{R_3 + R_4} V_{dd} \quad (2)$$

Figure 2A:
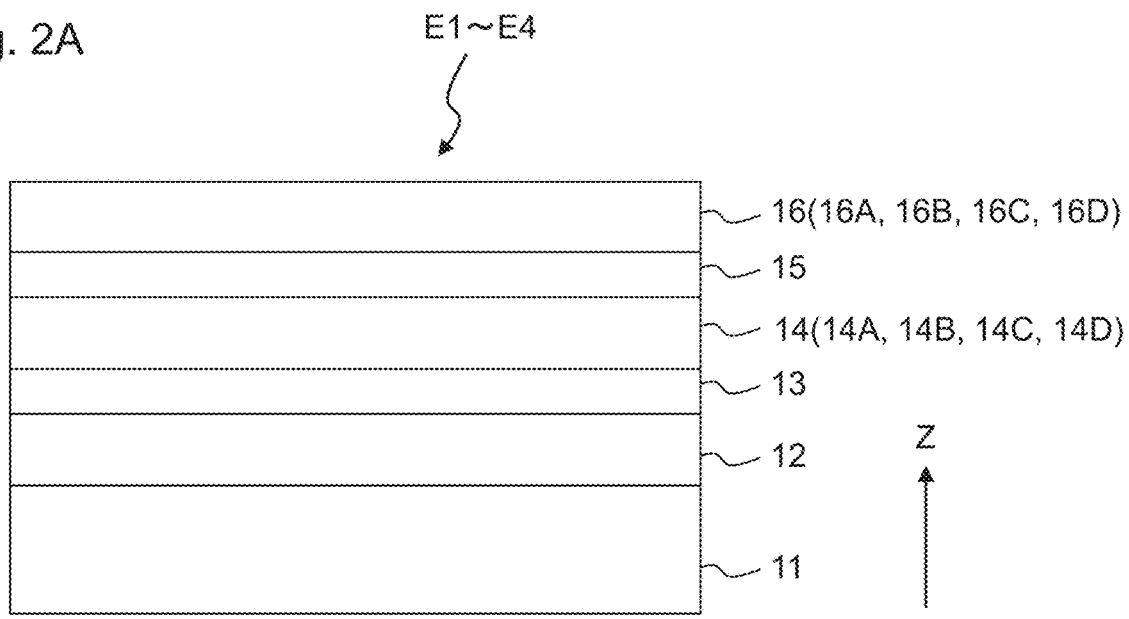
FIGS. 2A, 2B are conceptual views illustrating the schematic arrangement of the magnetoresistive effect element of the magnetic sensor shown in FIGS. 1A and 1B.
Figure 2B:
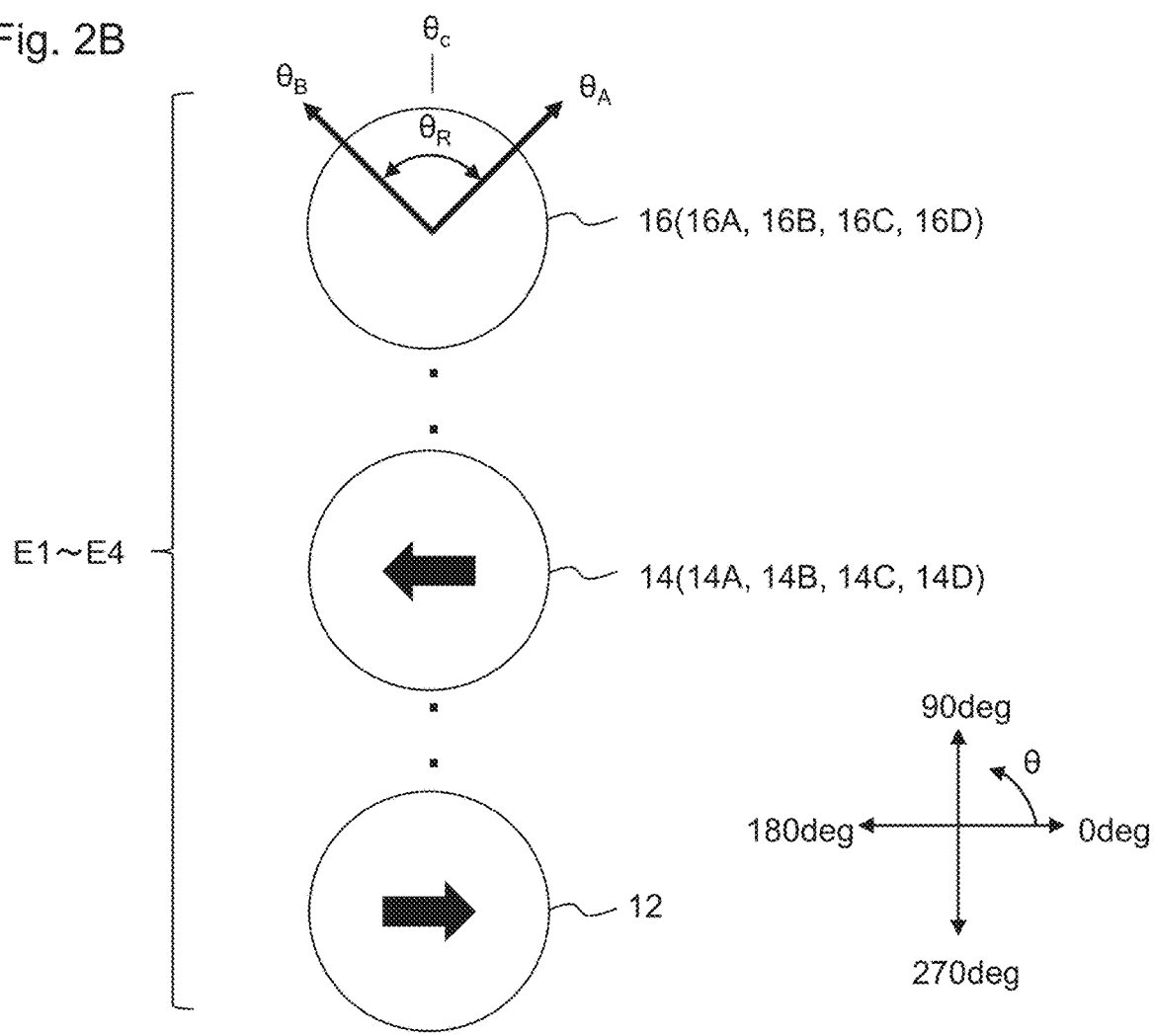

FIGS. 2A, 2B are conceptual view illustrating the schematic arrangement of first to fourth magnetoresistive effect elements E1 to E4. FIG. 2A shows the layer arrangement of first to fourth magnetoresistive effect elements E1 to E4, and FIG. 2B shows sectional views of magnetically free layer 16, inner magnetically pinned layer 14 and outer magnetically pinned layer 12, as viewed in the Z direction. First to fourth magnetoresistive effect elements E1 to E4 have the identical arrangement. First to fourth magnetoresistive effect elements E1 to E4 have a layer arrangement of a typical spin-valve type. First to fourth magnetoresistive effect elements E1 to E4 are stacks of layers, wherein each stack includes antiferromagnetic layer 11, outer magnetically pinned layer 12, non-magnetic intermediate layer 13, inner magnetically pinned layer 14, spacer layer 15 and magnetically free layer 16, and these layers 11 to 16 are stacked in the Z direction in the order described above. The stack of layers is interposed between a pair of electrode layers (not illustrated) in the Z direction so that a sensing current flows through the stack of layers in the Z direction from the electrode layer.

Magnetically free layer 16 is a magnetic layer whose magnetization direction changes in accordance with an external magnetic field, and may be formed, for example, of NiFe. Outer magnetically pinned layer 12 is a ferromagnetic layer whose magnetization direction is pinned relative to the external magnetic field by the exchange coupling with antiferromagnetic layer 11. Antiferromagnetic layer 11 may be formed of PtMn, IrMn, NiMn, and the like. Inner magnetically pinned layer 14 is a ferromagnetic layer that is interposed between outer magnetically pinned layer 12 and spacer layer 15, and is antiferromagnetically coupled to outer magnetically pinned layer 12 via non-magnetic intermediate layer 13, such as a Ru or Rh film. Accordingly, the magnetization direction of inner magnetically pinned layer 14 and the magnetization direction of outer magnetically pinned layer 12 are pinned relative to the external magnetic field, but the magnetization directions are anti-parallel to each other. Spacer layer 15 is a non-magnetic layer that is positioned between magnetically free layer 16 and inner magnetically pinned layer 14 and that exhibits the magnetoresistive effect. Spacer layer 15 is a non-magnetic conductive layer that is formed of a non-magnetic metal, such as Cu, or a tunnel barrier layer that is formed of a non-magnetic insulator, such as $Al_2O_3$. When spacer layer 15 is a non-magnetic conductive layer, first to fourth magnetoresistive effect elements E1 to E4 function as giant magnetoresistive effect (GMR) elements, and when spacer layer 15 is a tunnel barrier layer, first to fourth magnetoresistive effect elements E1 to E4 function as tunnel magnetoresistive effect (TMR) elements. First to fourth magnetoresistive effect elements E1 to E4 are preferably TMR elements because of a large MR ratio and a large output from the bridge circuit. Note that inner magnetically pinned layer 14 may be simply referred to as a magnetically pinned layer in the specification.

As shown in FIG. 2B, magnetically free layer 16, inner magnetically pinned layer 14 and outer magnetically pinned layer 12, that is, first magnetoresistive effect element E1, have substantially circular sections, as viewed in the Z direction. The arrows in the drawing conceptually show the magnetization directions of layers 16, 14, 12. The magnetization direction of magnetically free layer 16 rotates in accordance with the direction of the external magnetic field. Any bias magnet that applies a bias magnetic field to magnetically free layer 16 is not provided. As a result, the magnetization direction of magnetically free layer 16 substantially coincides with the direction of an external magnetic field. The direction of the magnetic field that is applied to magnetically free layer 16 varies within a specific angular range between angle $θ_A$ and angle $θ_B$ that are defined relative to a specific reference angle (θ=0 degree). The specific angular range is called magnetic field detecting angular range $θ_R$. Magnetic field detecting angular range $θ_R$ defines the magnetically sensitive direction of magnetic sensor 1, and is limited by the product or the part into which magnetic sensor 1 is incorporated. The magnetization direction of magnetically free layer 16 rotates about center value $θ_c$ of magnetic field detecting angular range $θ_R$ within magnetic field detecting angular range $θ_R$ in accordance with the direction of an external magnetic field. The change in the relative angle between the magnetization direction of inner magnetically pinned layer 14 and the magnetization direction of magnetically free layer 16 change the electric resistivity for the sensing current, and thereby the direction of the external magnetic field can be detected.

Referring again to FIG. 1A, the magnetization directions θ1 to θ4 of inner magnetically pinned layers 14 of first to fourth magnetoresistive effect elements E1 to E4 are directed in the direction of the arrows in the drawing. Therefore, when an external magnetic field is applied at angle θ that is smaller than 90 degrees, the electric resistivities of first and third magnetoresistive effect elements E1, E3 become larger than the electric resistivities of second and fourth magnetoresistive effect elements E2, E4. As a result, intermediate voltage V1 becomes smaller than intermediate voltage V2 and differential voltage V1-V2 becomes negative, as shown in FIG. 1B. When an external magnetic field is applied at angle θ that is larger than 90 degrees, intermediate voltage V1 becomes larger than intermediate voltage V2 reversely, and differential voltage V1-V2 becomes positive. The sensitivity is doubled by detecting differential voltage V1-V2 of intermediate voltages V1, V2, as compared to a case where intermediate voltages V1, V2 are detected. In addition, even if there is an offset in intermediate voltages V1, V2, the influence of the offset can be removed by detecting differential voltage V1-V2. Differential voltage V1-V2 defines output range $V_R$ of magnetic sensor 1. Output range $V_R$ is proportional to the sensitivity of magnetic sensor 1, but a large output range $V_R$ is not always desirable. Desirable output range $V_R$ depends on the product or the part into which magnetic sensor 1 is incorporated.

Figure 3:
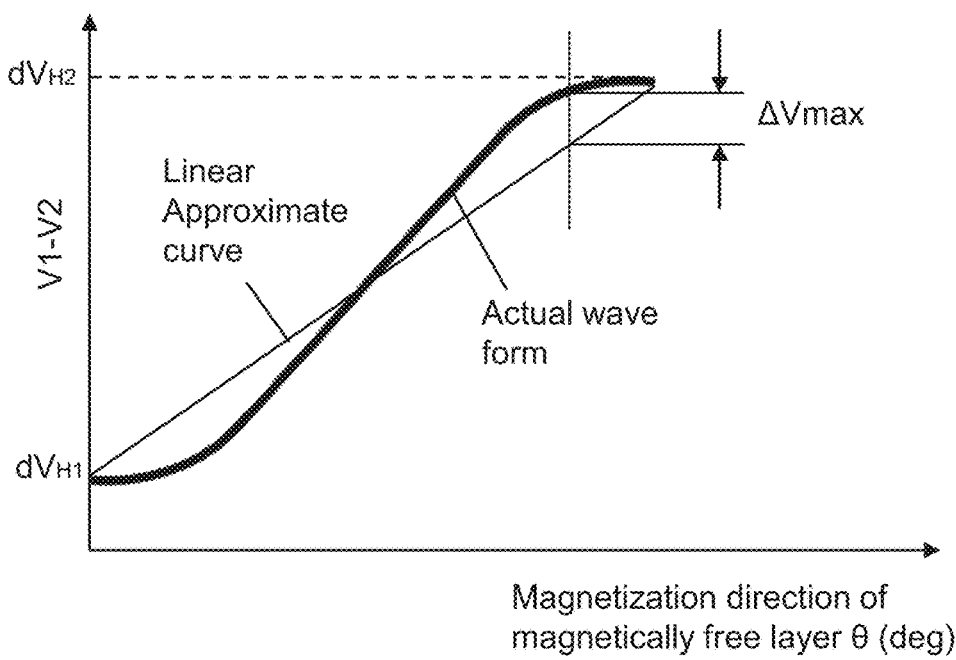
FIG. 3 is a conceptual view illustrating the definition of linearity error.

It is desired that the output of magnetic sensor 1 be linear as much as possible. Here, linearity error $E_L$ is defined as an indicator of linearity. As shown in FIG. 3, suppose that an actual wave form of the output of magnetic sensor 1 is obtained for a specific angular range of the magnetization direction of magnetically free layer 16. In order to define linearity error $E_L$, a linear approximate line of the actual wave form is first obtained. The linear approximate line can be calculated, for example, but not limited to, the least square method. Suppose that $dV_{H2}$ is the maximum value of the output within the above specific angular range, and $dV_{H1}$ is the minimum value of the output within the above specific angular range. The difference between the actual wave form and the linear approximate line is calculated at each angle θ in the above specific angular range. Then, linearity error $E_L$ is calculated as follows, where $\Delta V_{max}$ is the maximum difference.

$$\frac{\Delta V_{max}}{dV_{H2} - dV_{H1}} \quad (3)$$

Linearity error $E_L$ depends on the product or the part into which magnetic sensor 1 is incorporated, but linearity error $E_L$ is typically between 5 and 10%. Thus, $E_L$ is set to be 5% in the present embodiment. Linearity error $E_L$ is not limited to formula (3), and any other indicator that indicates the linearity may be used. The angular range in which $E_L$ is equal to a predetermined value (here, $E_L$=5%) is referred to as linearity range $θ_L$. Linearity range $θ_L$ is an angular range of the magnetization direction of first to fourth magnetically free layers 16A to 16D (the angular range of an external magnetic field) that satisfies a specific linear relationship (here $E_L$=5%) between the angular range of the magnetization direction and the output of magnetic sensor 1. The condition that is required for linearity range $θ_L$ is different depending on the product or the part into which magnetic sensor 1 is incorporated. For the product or the part into which magnetic sensor 1 is incorporated, linearity range $θ_L$ means an angular range of the magnetization direction of first to fourth magnetically free layers 16A to 16D, in which the relationship between the magnetization direction and the output can be regarded as substantially linear. For example, in the case of an autofocus mechanism of a camera, a magnet that generates an external magnetic field and magnetic sensor 1 that detects the external magnetic field move relative to each other in the direction of the optical axis of the lens, but the range of the relative movement is limited by the autofocus mechanism. Therefore, the direction of an external magnetic field that is applied to magnetically free layer 16 of magnetic sensor 1 is limited to a predetermined angular range, and magnetic sensor 1 is not required to have linearity range $θ_L$ that exceeds the predetermined angular range.

Figure 4:
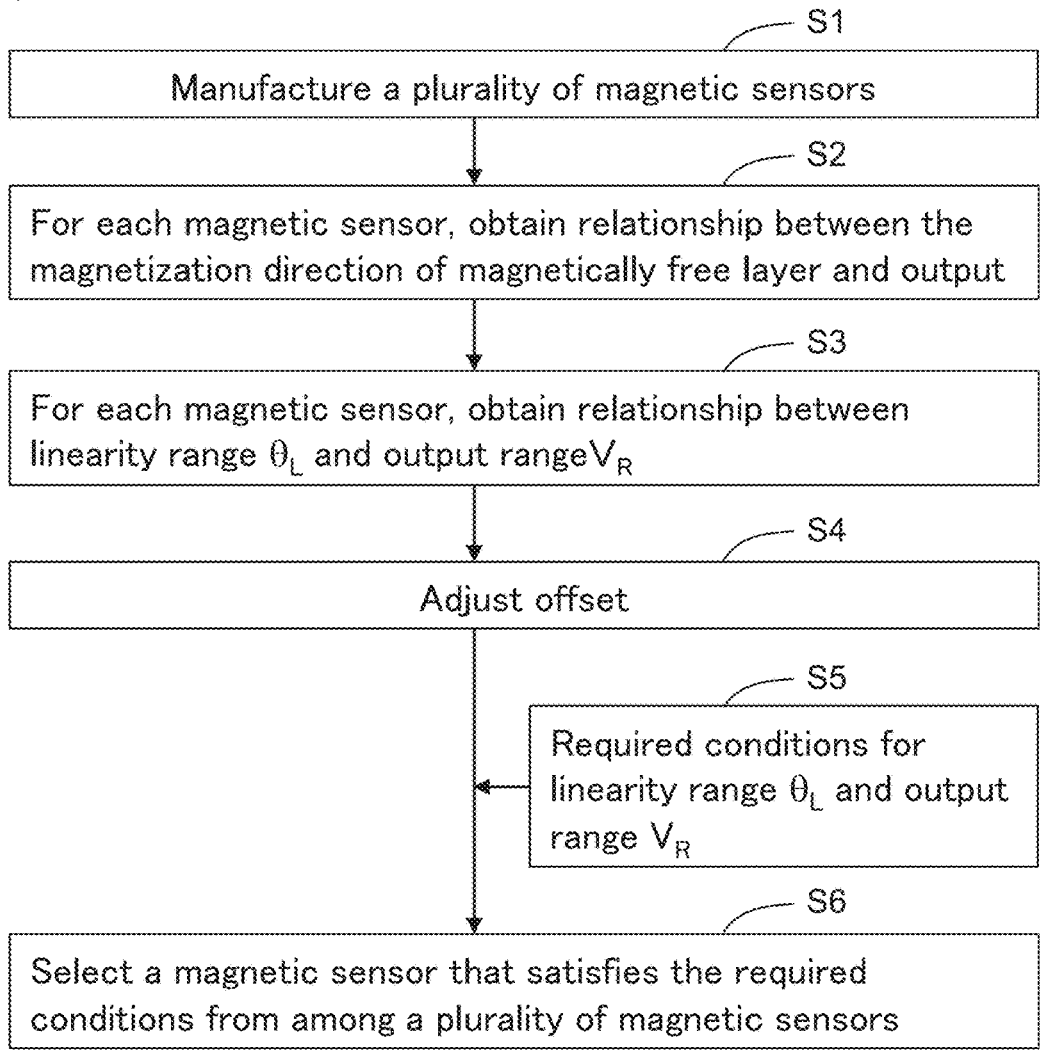
FIG. 4 is a flow chart illustrating an exemplary method of designing a magnetic sensor.

A method of designing magnetic sensor 1 described above will now be described. As described above, output range $V_R$ and linearity range $θ_L$ are both important as the design conditions of magnetic sensor 1, and the present embodiment provides a design method that takes into consideration output range $V_R$ and linearity range $θ_L$. FIG. 4 shows a schematic flow of the present method. A plurality of magnetic sensors 1 are manufactured or prepared first (Step 1). Magnetic sensors 1 may be actually manufactured or may be provided by a simulation. In magnetic sensors 1, the magnetization directions of first to fourth magnetically pinned layers 14A to 14D form first to fourth angles θ1 to θ4 relative to the specific reference angle (θ=0 degree), respectively, and the relationships: θ1=θ3, θ2=θ4, θ1≠θ2 (therefore, θ3≠θ4) are satisfied. However, each magnetic sensor 1 has a value of θ1-θ2 that is different from the values of θ1-θ2 of the remaining magnetic sensors 1. Here, six magnetic sensors 1 are manufactured, in which θ1=θ3=180 degrees for all of the six magnetic sensors 1, while θ2 and θ4 are equal to 0 degree, 30 degrees, 60 degrees, 90 degrees, 120 degrees and 150 degrees for respective magnetic sensors 1.

Figure 5A:
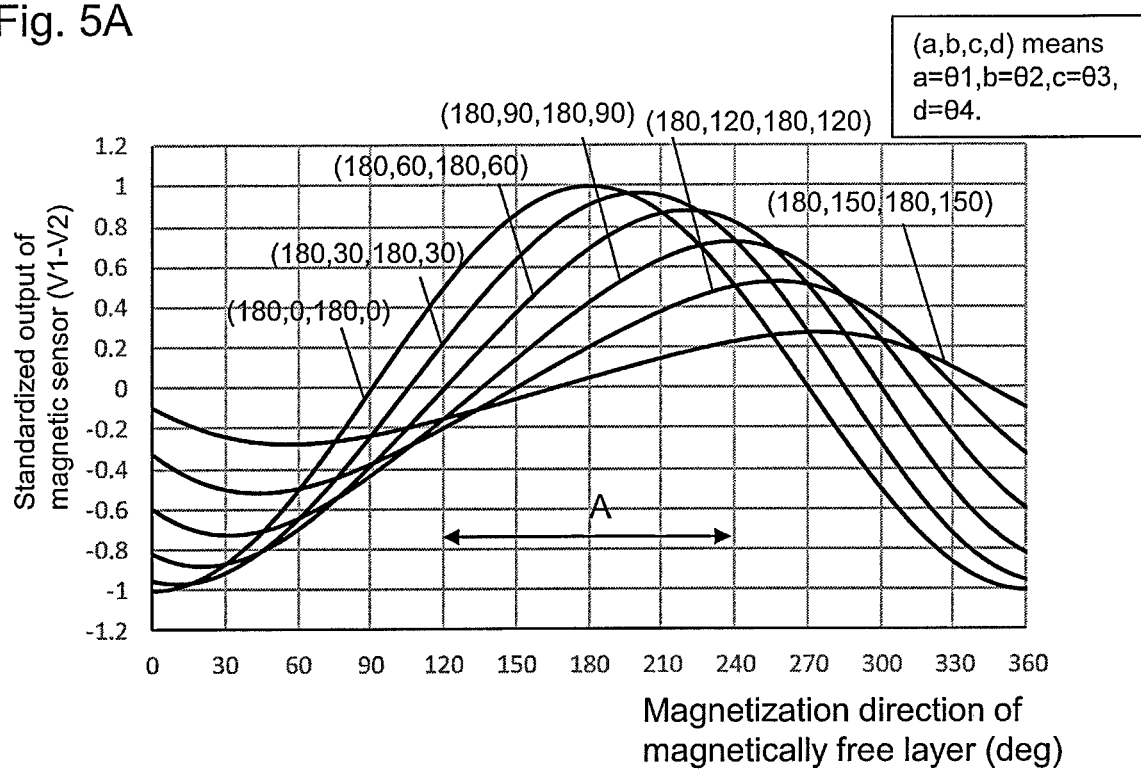
FIGS. 5A, 5B are views illustrating the properties of a magnetic sensors, wherein the properties are obtained in steps S2 and S3.

Next, the relationship between the magnetization direction of magnetically free layers 16 and output range $V_R$ is obtained for each magnetic sensor 1 (Step 2). FIG. 5A shows the results of obtaining the relationship between the magnetization direction of magnetically free layer 16 and the output of magnetic sensor 1 (differential voltage V1-V2) for the six magnetic sensors 1. The maximum output is obtained when θ2=θ4=0 degree or 30 degrees. As θ2 and θ4 increase, the output decreases and the gradient of the linear part of the graph decreases.

Figure 5B:
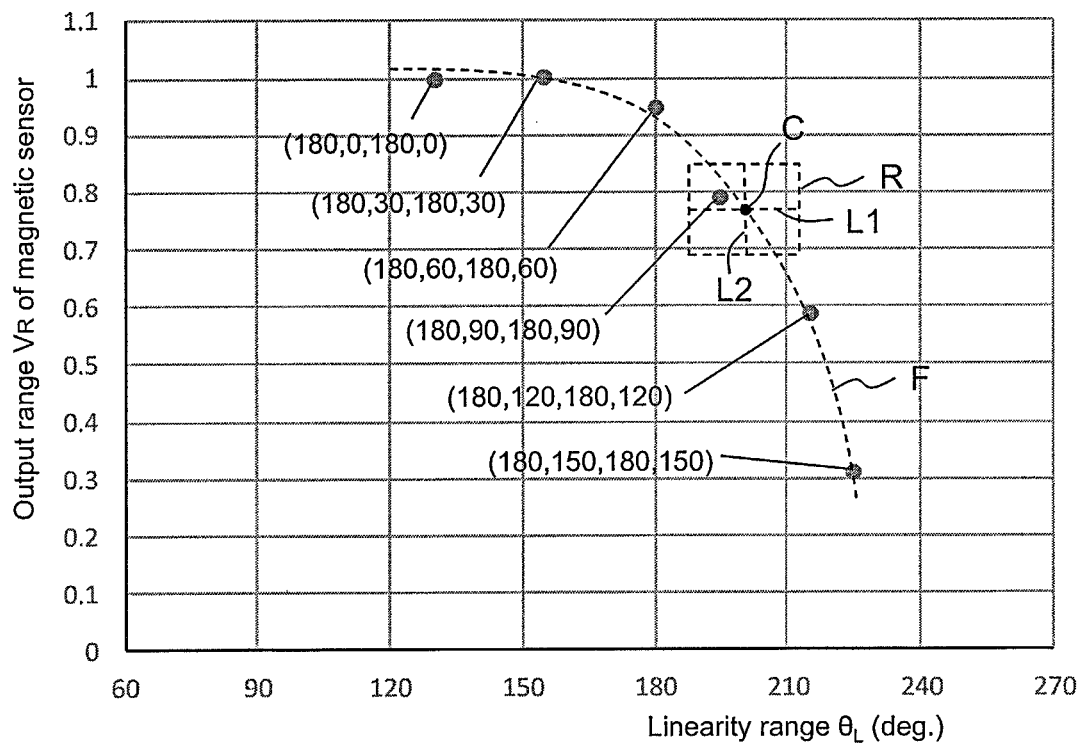

Next, the relationship between the angular range of the magnetization direction of first to fourth magnetically free layers 16 (linearity range $θ_L$) and the output range $V_R$ of magnetic sensor 1 is obtained for each magnetic sensor 1, wherein, the angular range satisfies the specific linear relationship (here $E_L$=5%) between the magnetization direction of first to fourth magnetically free layers 16 and the output of magnetic sensor 1 (Step 3). FIG. 5B shows an example of the results. The vertical axis shows standardized output range $V_R$. Furthermore, approximate curve F of output range $V_R$ may be obtained from the plotted points. Approximate curve F may be calculated, for example, by the least square method. As will be understood from the figure, there is a negative correlation between linearity range $θ_L$ and output range $V_R$. When large output range $V_R$ is desired even if linearity range $θ_L$ is small, small θ2 and θ4 can be selected, and when linearity range $θ_L$ is more important than output range $V_R$, large θ2 and θ4 can be selected.

Next, magnetic sensor 1 that satisfies the required conditions for linearity range $θ_L$ and output range $V_R$ is selected from among a plurality of magnetic sensors 1 (Steps S5, S6). The selection may be made by an operator while referring to FIG. 5B or may be made by a computer. When the required conditions for linearity range $\theta_L$ and output range $V_R$ are given as numerical ranges, respectively, the required conditions may be defined as a specific rectangular region R in FIG. 5B. In the example illustrated, magnetic sensor 1 with $\theta 2=\theta 4=90$ degrees will be selected. Intersection C between the approximate curve and horizontal line L1 that halves region R in the direction of the vertical axis or between the approximate curve and vertical line L2 that halves region R in the direction of the horizontal axis may be selected as optimal values of $\theta 2$ and $\theta 4$. When the selection is made by a computer, the following steps are taken: the relationship between the magnetization direction of magnetically free layers 16 and output range $V_R$ (FIG. 5A) is inputted for a plurality of magnetic sensors 1, the required conditions for linearity range $\theta_L$ and output range $V_R$ are inputted, and the values of $\theta 2$ and $\theta 4$ or the ranges of $\theta 2$ and $\theta 4$ that satisfy the required conditions are calculated by the CPU.

Figure 6A:
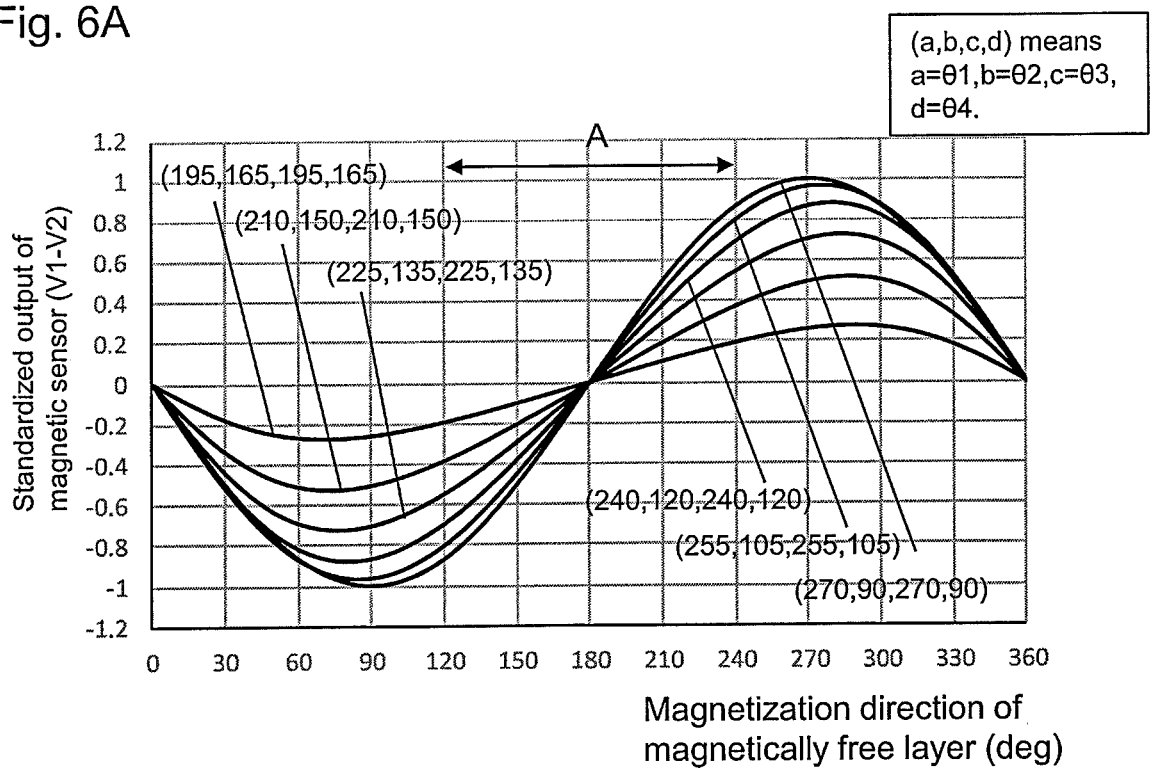
FIGS. 6A, 6B are views illustrating the properties of magnetic sensors, wherein the properties are obtained in step S4.
Figure 6B:
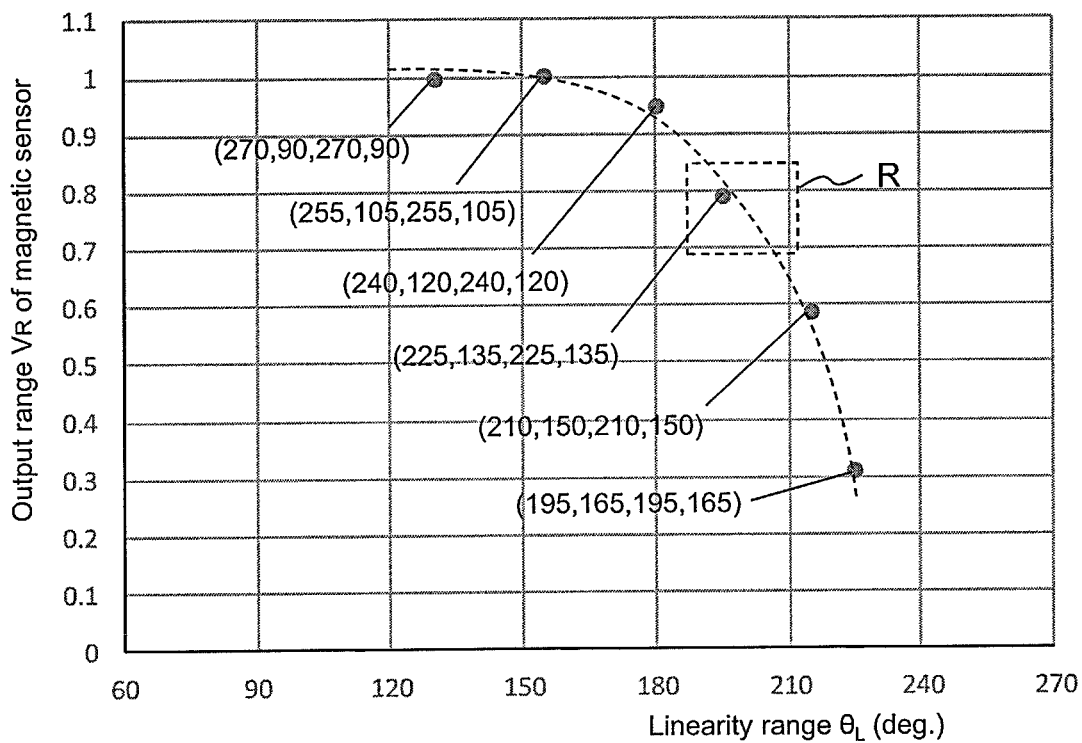
Figure 7A:
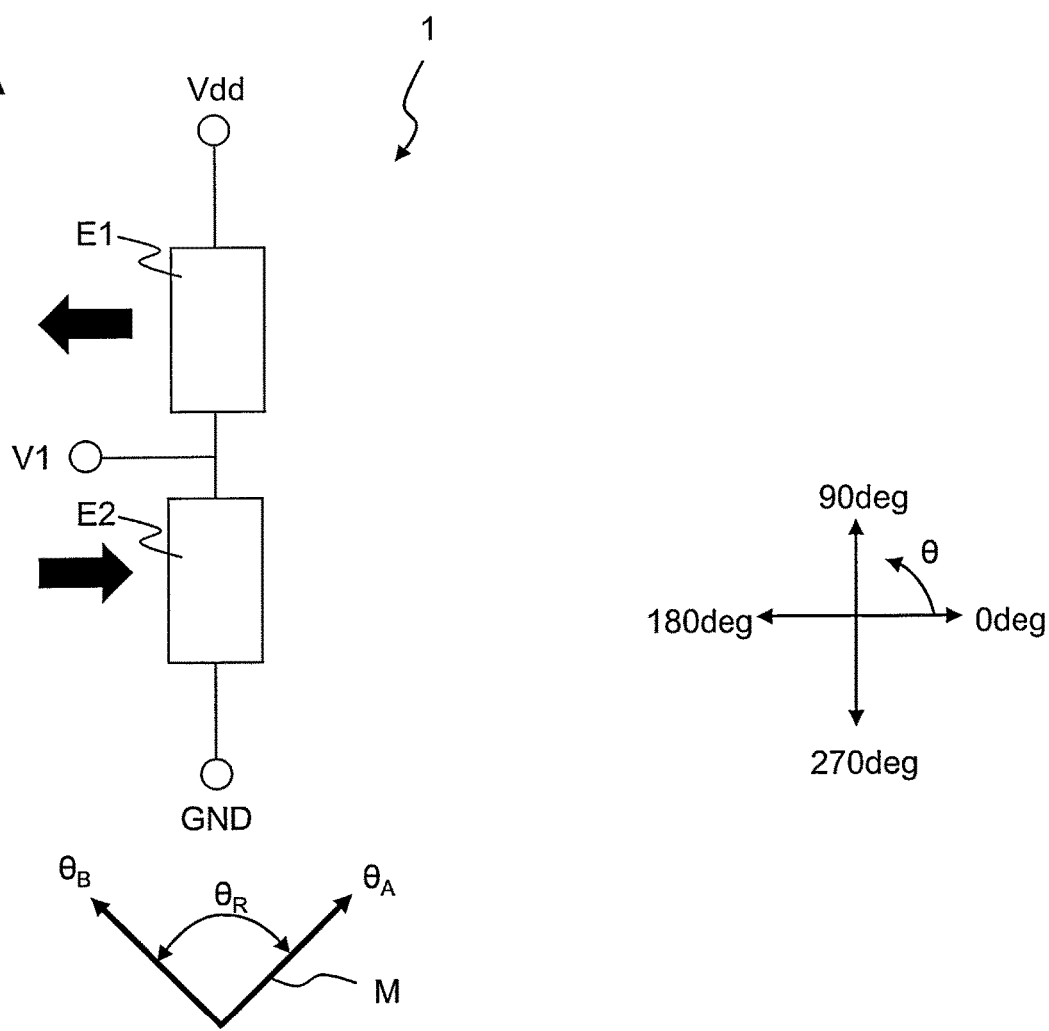
FIGS. 7A, 7B are conceptual views illustrating the schematic arrangement of a magnetic sensor according to a second embodiment.
Figure 7B:
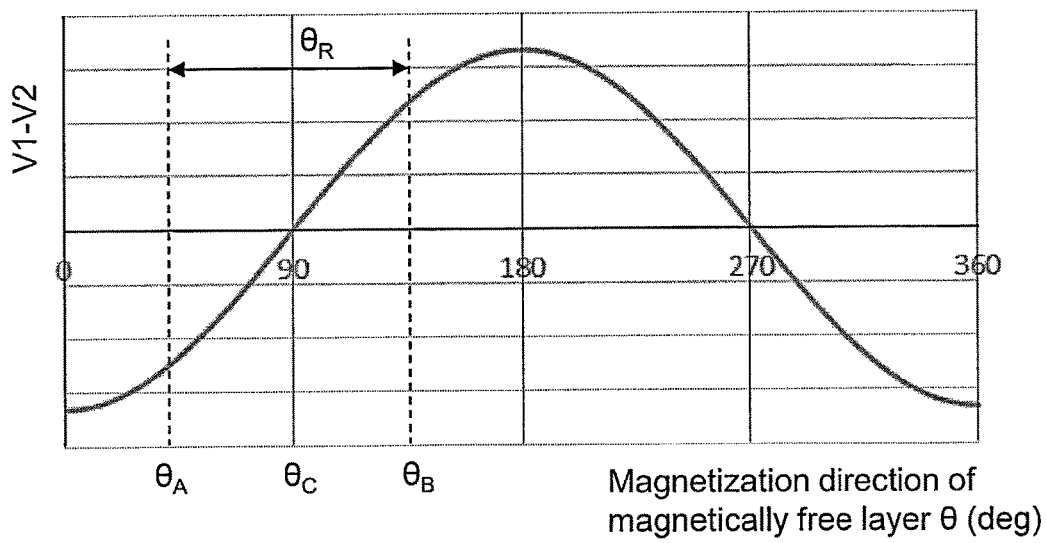

It is desired that magnetic sensor 1 be used in a region having good linearity of the output. However, as described above, an external magnetic field is applied within specific magnetic field detecting angular range $\theta_R$. For example, when magnetic field detecting angular range $\theta_R$ is an angular range between 120 and 240 degrees with the center value of 180 degrees, as shown by region A in FIG. 5A, a region having bad linearity may be used depending on magnetic sensor 1, and the precision of measurement deteriorates. In this case, if the output at $\theta=180$ degrees corresponds to the center value (V1=V2) of output range $V_R$, as shown by region A in FIG. 6A, then the region having good linearity will be able to be used most effectively. For this reason, the graph of FIG. 5A is preferably modified before magnetic sensor 1 is selected. Specifically, the relationship among first to fourth angles $\theta 1$ to $\theta 4$ is fixed, and first to fourth angles $\theta 1$ to $\theta 4$ are modified such that the relationship $(\theta 1+\theta 2)/2=\theta_c$ is satisfied (Step S4). Fixing the relationship among first to fourth angles $\theta 1$ to $\theta 4$ means that the difference between $\theta 1$ and $\theta 2$, the difference between $\theta 1$ and $\theta 3$ and the difference between $\theta 1$ and $\theta 4$ are all unchanged (constant). In the example shown in FIG. 5A, $\theta_c$ is equal to 180 degrees. FIG. 6A shows the relationship between the magnetization direction of magnetically free layers 16 and the output of magnetic sensors 1 that is obtained by this process, and FIG. 6B shows the relationship between linearity range $\theta_L$ and output range $V_R$. Each curve in FIG. 6A is obtained by the translation of the corresponding curve in FIG. 5A, and each curve in FIG. 6A has the same shape as the corresponding curve in FIG. 5A. Therefore, the graph of FIG. 6B coincides with the graph of FIG. 5B. The selection of magnetic sensor 1 may be made based on either the graph of FIG. 5B or the graph of FIG. 6B. However, by selecting magnetic sensor 1 based on the graph of FIG. 6B, optimal values of first to fourth angle $\theta 1$ to $\theta 4$ can be obtained at one time.

Step S4 has the same effect as rotating magnetic sensor 1 as a whole. However, it may be difficult to rotate and arrange magnetic sensor 1 in some cases. The magnetization direction of magnetically pinned layer 14 can be easily adjusted by changing the magnetizing direction, and thus, the present embodiment can provide a versatile method of designing magnetic sensor 1. In addition, magnetically pinned layer 14 having a circular section does not have directivity and can be magnetized in the same manner in any direction. Similarly, magnetically free layer 16 having a circular section does not have directivity (the shape anisotropy), and the magnetization direction rotates in the same manner regardless of the direction in which an external magnetic field is applied. In other words, since the magnetoresistive effect element does not have inherent directivity that is caused by the shape, the magnetization direction of magnetically pinned layer 14 can be widely modified depending on use. For the reasons above, the present embodiment has strong affinity with circular magnetoresistive effect elements.

A method of manufacturing magnetic sensor 1 that is designed using the aforementioned method will now be briefly described. The method of manufacturing magnetic sensor 1 includes the step of forming first to fourth magnetoresistive effect elements E1 to E4. In this step, first to fourth initial magnetoresistive effect elements that are later to be first to fourth magnetoresistive effect elements E1 to E4 are formed first. The first to fourth initial magnetoresistive effect elements include first to fourth initial magnetically pinned layers that are later to be inner magnetically pinned layers 14, respectively.

Next, laser beam and an external magnetic field in a predetermined direction are used to pin the magnetization directions of the first to fourth initial magnetically pinned layers in the predetermined directions. For example, first and third initial magnetoresistive effect elements that are later to be first and third magnetoresistive effect elements E1, E3 are irradiated with laser beam while applying an external magnetic field in first magnetization direction $\theta 1$, $\theta 3$. When the irradiation with the laser beam is completed, the magnetization directions of the first and third initial magnetically pinned layers are pinned in first magnetization direction $\theta 1$, $\theta 3$. Thus, first and third initial magnetically pinned layers are formed into the first and third magnetically pinned layers, and the first and third initial magnetoresistive effect elements are formed into first and third magnetoresistive effect elements E1, E3. In addition, in case of the second and fourth initial magnetoresistive effect elements that are later to be second and fourth magnetoresistive effect elements E2, E4, by directing the external magnetic field in the magnetization direction $\theta 2$, $\theta 4$, the magnetization directions of the initial magnetically pinned layers of the second and fourth initial magnetoresistive effect elements can be pinned in the second magnetization direction $\theta 2$, $\theta 4$. In this manner, first to fourth magnetoresistive effect elements E1 to E4 are formed.

The method of pining the magnetization directions of the magnetically pinned layers (the initial magnetically pinned layers) using laser beam may also be so called laser annealing.

Second Embodiment

The present embodiment is the same as the first embodiment except that the magnetoresistive effect elements are interconnected by a half bridge, instead of a Wheatstone bridge. Magnetic sensor 1 has first magnetoresistive effect element E1 and second magnetoresistive effect element E2 that are connected in a row. First magnetoresistive effect element E1 has first magnetically pinned layer 14A whose magnetization direction is pinned and first magnetically free layer 16A whose magnetization direction rotates in accordance with an external magnetic field. Second magnetoresistive effect element E2 has second magnetically pinned layer 14B whose magnetization direction is pinned and has second magnetically free layer 16B whose magnetization direction rotates in accordance with the external magnetic field.

In the present embodiment, the design of magnetic sensor 1 can be performed in the same manner as in the first embodiment in accordance with the steps shown in FIG. 4. Specifically, a plurality of magnetic sensors 1 is manufactured, in which the magnetization direction of first magnetically pinned layer 16A forms first angle θ1 relative to the specific reference angle (here θ=0 degree) and in which the magnetization direction of the second magnetically pinned layer 16B forms second angle θ2 relative to the specific reference angle. Each magnetic sensor 1 has a value of θ1-θ2 that is different from the values of θ1-θ2 of the remaining magnetic sensors 1 (Step 1). Magnetic sensors 1 may be actually manufactured or may be provided by a simulation. Next, the relationship between the magnetization direction of magnetically free layers 16 and output range $V_R$ is obtained for each magnetic sensor 1 (Step 2). Next, the relationship between the angular range of the magnetization direction of first and second magnetically free layers 16 (linearity range $θ_L$) and the output range $V_R$ of magnetic sensor 1 is obtained for each magnetic sensor 1, wherein, the angular range satisfies the specific linear relationship between the magnetization directions of first and second magnetically free layers 16 and the output of magnetic sensor 1 (Step 3). Next, magnetic sensor 1 that satisfies the required conditions for linearity range $θ_L$ and output range $V_R$ is selected from among a plurality of magnetic sensors 1 (Steps S5, S6). Before magnetic sensor 1 is selected, first angle θ1 and second angle θ2 may be modified such that the relationship $(θ1+θ2)/2=θ_c$ is satisfied with (θ1-θ2) being fixed (Step S4). Magnetic sensor 1 that is designed using the method of the present embodiment may be manufactured by the method that is described in the first embodiment.

Figure 8A:
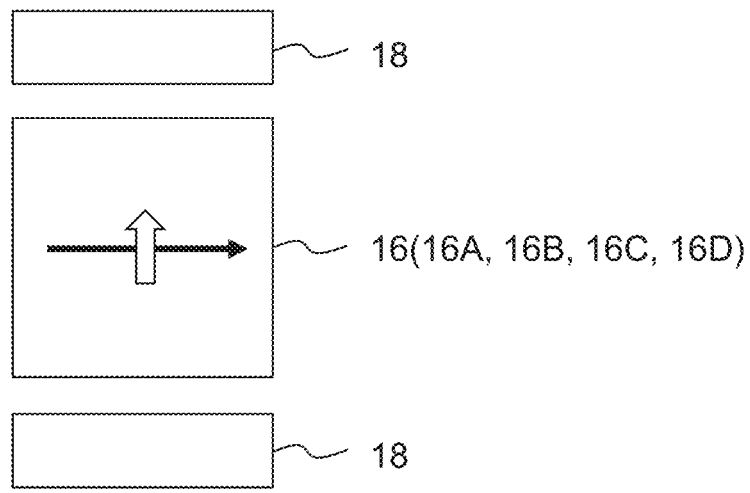
FIGS. 8A, 8B are conceptual views illustrating the schematic arrangement of a magnetic sensor according to a modification.
Figure 8B:
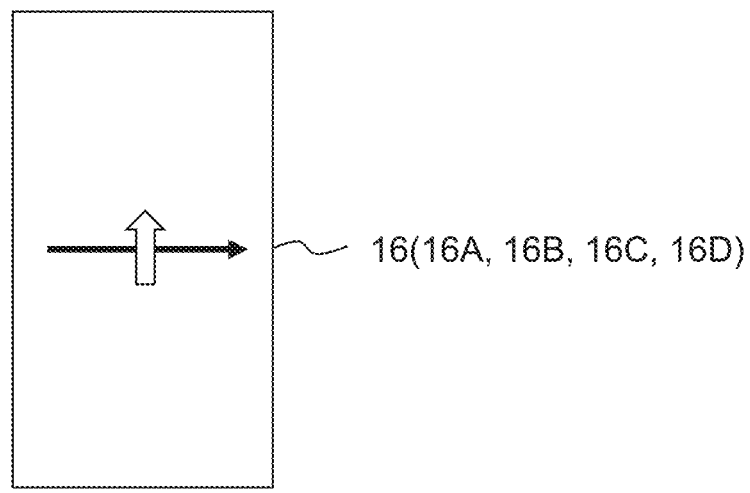

The present invention has been described by the embodiments, but the present invention is not limited to these embodiments, and various modifications can be made. For example, as shown in FIG. 8A, magnetic sensor 1 may have bias magnets 18 that apply a bias magnetic field to magnetically free layer 16. In the drawing, the black arrow shows the direction in which an external magnetic field is applied, and the white arrow shows the direction in which the bias magnetic field is applied. The direction of the external magnetic field is fixed, and only the intensity of external magnetic field changes. A pair of bias magnets 18 is provided. Bias magnets 18 are provided on both sides of each magnetoresistive effect element E1 to E4, and a bias magnetic field is applied in a direction perpendicular to the magnetization direction of magnetically pinned layer 14. A combined magnetic field, which is the combination of the bias magnetic field and the external magnetic field, is applied to magnetically free layer 16. Since the electric resistivities of magnetoresistive effect elements E1 to E4 change in accordance with the direction of the combined magnetic field, the intensity of the external magnetic field can be obtained from the output of magnetic sensor 1. Alternatively, as shown in FIG. 8B, magnetoresistive effect elements E1 to E4 may be formed in a shape that is elongate in one direction. The magnetization direction of magnetically free layer 16 is directed in the elongate direction due to shape anisotropy when no magnetic field is applied, and the same effect can be achieved.

In addition, magnetic sensor 1 operates at a constant voltage in the present embodiment, but may operate at a constant current. In the operation of a constant current, the sum of the current that is supplied to first magnetoresistive effect element E1 and fourth magnetoresistive effect element E4 (in the first embodiment) or the current that is supplied to first magnetoresistive effect element E1 (in the second embodiment) is maintained at a constant value. Although not described in detail, the same properties as shown in FIGS. 5 and 6 are obtained in this case, and the design of magnetic sensor 1 can be performed in accordance with the above-mentioned method.

Although certain preferred embodiments of the present invention have been shown and described in detail, it should be understood that various changes and modifications may be made without departing from the spirit or scope of the appended claims.

LIST OF REFERENCE NUMERALS 1 magnetic sensor
14A to 14D first to fourth magnetically pinned layers
16A to 16D first to fourth magnetically free layers
E1 to E4 first to fourth magnetoresistive effect elements

What is claimed is:
1. A method of designing a magnetic sensor, wherein the magnetic sensor comprises:
a pair of a first magnetoresistive effect element and a second magnetoresistive effect element that are connected in series; and
a pair of a third magnetoresistive effect element and a fourth magnetoresistive effect element that are connected in series, wherein
the pair of the first and second magnetoresistive effect elements and the pair of the third and fourth magnetoresistive effect elements are connected in parallel,
the first and fourth magnetoresistive effect elements are connected to a power supply, and
the first to fourth magnetoresistive effect elements have first to fourth magnetically pinned layers whose magnetization directions are pinned and first to fourth magnetically free layers whose magnetization directions rotate in accordance with an external magnetic field, respectively,
the method comprising the steps of:
preparing magnetic sensors, wherein, for each magnetic sensor, magnetization directions of the first to fourth magnetically pinned layers form first to fourth angles θ1 to θ4 relative to a specific reference angle, respectively, and θ1=θ3, θ2=θ4, θ1*θ2, and each magnetic sensor has a value of θ1-θ2 that is different from values of θ1-θ2 of remaining magnetic sensors,
for each magnetic sensor, obtaining a relationship between an angular range of the magnetization direction of the first to fourth magnetically free layers and an output range of the magnetic sensor, wherein the angular range satisfies a specific linear relationship between the magnetization direction and the output of the magnetic sensor, and
selecting a magnetic sensor that satisfies required conditions for the angular range and the output range from among the magnetic sensors.

2. The method of designing a magnetic sensor according to claim 1, further comprising the step of modifying the first to fourth angles θ1 to θ4 before the magnetic sensor is selected, wherein the first to fourth angles θ1 to θ4 are modified such that relationship $(θ1+θ2)/2=θ_c$ (θc is a center value of a magnetic field detecting angular range of the magnetic sensor relative to the specific reference angle) is satisfied, with a relationship among the first to fourth angles θ1 to θ4 being fixed.

3. The method of designing a magnetic sensor according to claim 1, wherein the first to fourth magnetically pinned layers and the first to fourth magnetically free layers have circular sections.

4. A method of manufacturing a magnetic sensor that is designed using the method of designing a magnetic sensor according to claim 1, the method comprising the step of forming the first to fourth magnetoresistive effect elements, wherein
the step of forming the first to fourth magnetoresistive effect elements includes the step of:
forming first to fourth initial magnetoresistive effect elements that include first to fourth initial magnetically pinned layers that are later to be the first to fourth magnetically pinned layers, respectively; and
pinning magnetization directions of the first to fourth initial magnetically pinned layers using laser beam and an external magnetic field.

5. A method of designing a magnetic sensor, wherein
the magnetic sensor comprises a first magnetoresistive effect element and a second magnetoresistive effect element that are connected in series, wherein
the first magnetoresistive effect element has a first magnetically pinned layer whose magnetization direction is pinned and a first magnetically free layer whose magnetization direction rotates in accordance with an external magnetic field, and
the second magnetoresistive effect element has a second magnetically pinned layer whose magnetization direction is pinned and a second magnetically free layer whose magnetization direction rotates in accordance with the external magnetic field
the method comprising the steps of:
preparing magnetic sensors, wherein for each magnetic sensor, a magnetization direction of the first magnetically pinned layer forms a first angle $\theta1$ relative to a specific reference angle, a magnetization direction of the second magnetically pinned layer forms a second angle $\theta2$ relative to the specific reference angle, and $\theta1 \neq \theta2$, and each magnetic sensor has a value of $\theta1-\theta2$ that is different from values of $\theta1-\theta2$ of remaining magnetic sensors,
for each magnetic sensor, obtaining a relationship between an angular range of the magnetization direction of the first and second magnetically free layers and an output range of the magnetic sensor, wherein the angular range satisfies a specific linear relationship between the magnetization direction and the output of the magnetic sensor, and
selecting a magnetic sensor that satisfies required conditions for the angular range and the output range from among the magnetic sensors.

6. The method of designing a magnetic sensor according to claim 5, further comprising the step of modifying the first and second angles $\theta1$, $\theta2$ before the magnetic sensor is selected, wherein the first and second angles $\theta1$, $\theta2$ are modified such that relationship $(\theta1+\theta2)/2=\theta_c$ ($\theta c$ is a center value of a magnetic field detecting angular range of the magnetic sensor relative to the specific reference angle) is satisfied, with a relationship between the first and second angles $\theta1$, $\theta2$ being fixed.

7. The method of designing a magnetic sensor according to claim 5, wherein the first and second magnetically pinned layers and the first and second magnetically free layers have circular sections.

8. A method of manufacturing a magnetic sensor that is designed using the method of designing a magnetic sensor according to claim 5, the method comprising the step of forming the first and second magnetoresistive effect elements, wherein
the step of forming the first and second magnetoresistive effect elements includes the step of:
forming first and second initial magnetoresistive effect elements that include first and second initial magnetically pinned layers that are later to be the first and second magnetically pinned layers, respectively; and
pinning magnetization directions of the first and second initial magnetically pinned layers using laser beam and an external magnetic field.

* * * * *

UNITED STATES PATENT AND TRADEMARK OFFICE
CERTIFICATE OF CORRECTION

| | | |
|---|---|---|
| PATENT NO. | : 11,598,827 B2 | |
| APPLICATION NO. | : 17/543951 | |
| DATED | : March 7, 2023 | |
| INVENTOR(S) | : Tsuyoshi Umehara, Kentaro Harada and Takafumi Kobayashi | |

It is certified that error appears in the above-identified patent and that said Letters Patent is hereby corrected as shown below:

In the Claims

Column 10, Line 42 Claim 1:
Delete "$\theta 1 * \theta 2$" and insert --$\theta 1 \neq \theta 2$--.

Signed and Sealed this
Ninth Day of May, 2023

Katherine Kelly Vidal
*Director of the United States Patent and Trademark Office*